United States Patent [19]

Zasio

[11] 4,414,480
[45] Nov. 8, 1983

[54] CMOS CIRCUIT USING TRANSMISSION LINE INTERCONNECTIONS

[75] Inventor: John J. Zasio, Sunnyvale, Calif.

[73] Assignee: Storage Technology Partners, Santa Clara, Calif.

[21] Appl. No.: 331,524

[22] Filed: Dec. 17, 1981

[51] Int. Cl.[3] .................. H03K 17/10; H03K 19/017; H03K 19/094

[52] U.S. Cl. .................................. 307/443; 307/270; 307/475; 333/32

[58] Field of Search ............... 307/270, 443, 451, 475, 307/576, 585; 333/32

[56] References Cited

U.S. PATENT DOCUMENTS

| | | | |
|---|---|---|---|
| 3,433,978 | 3/1969 | Bongenaar et al. | 307/443 X |
| 3,909,633 | 9/1975 | Hall | 307/443 X |
| 3,983,543 | 9/1976 | Cordaro | 307/475 X |
| 4,002,928 | 1/1977 | Goser et al. | 307/585 |
| 4,015,147 | 3/1977 | Davidson et al. | 307/270 X |
| 4,074,150 | 2/1978 | Buckley et al. | 307/443 X |
| 4,326,136 | 4/1982 | LeCan et al. | 307/451 |

Primary Examiner—Larry N. Anagnos
Assistant Examiner—David R. Hudspeth
Attorney, Agent, or Firm—Spensley, Horn, Jubas & Lubitz

[57] ABSTRACT

A CMOS output circuit for an integrated circuit chip used in high speed computers is designed so that it can drive transmission line interconnects to thereby increase the speed of the transfer of signals between chips. The CMOS circuit can drive either a nonterminated transmission line, a terminated transmission line or a random wire. The output circuit enables both low power consumption and high speed to be achieved.

12 Claims, 9 Drawing Figures

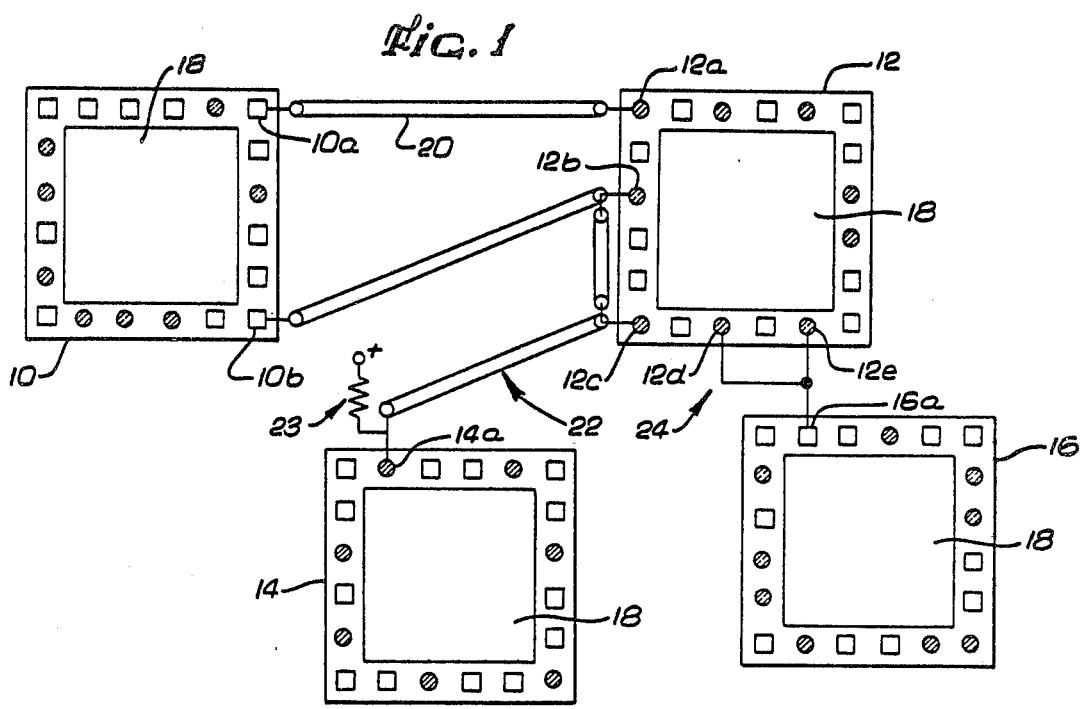

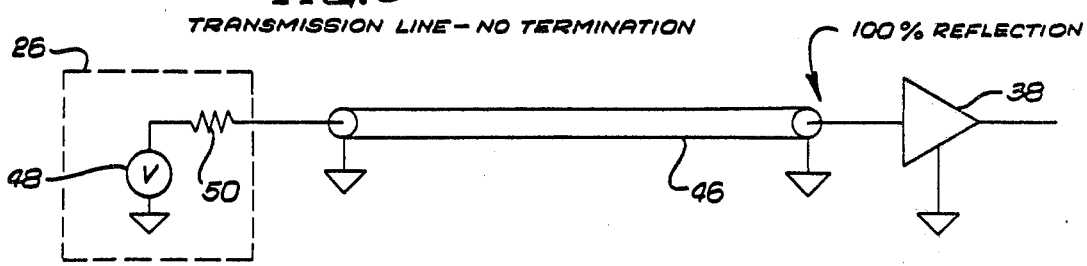
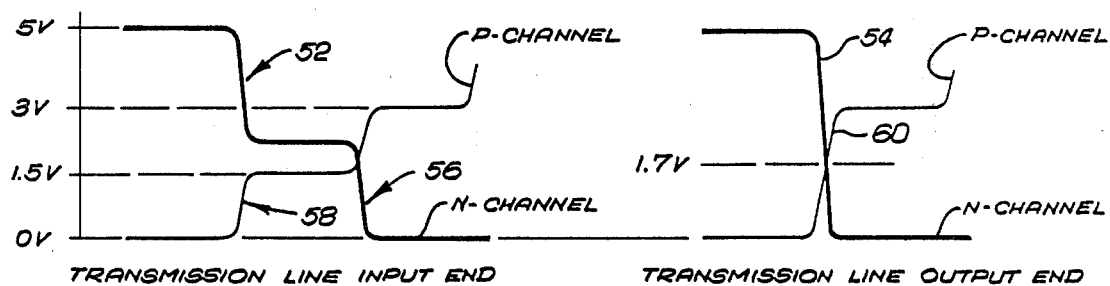
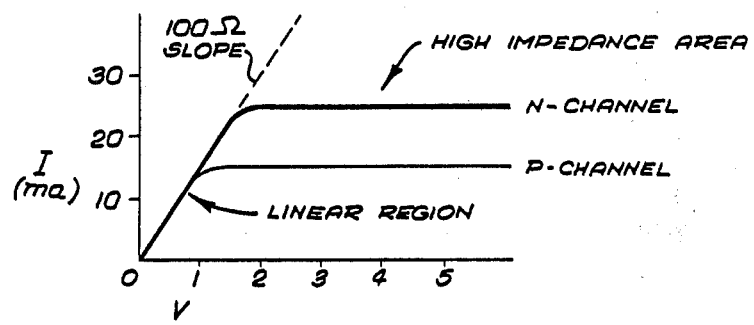
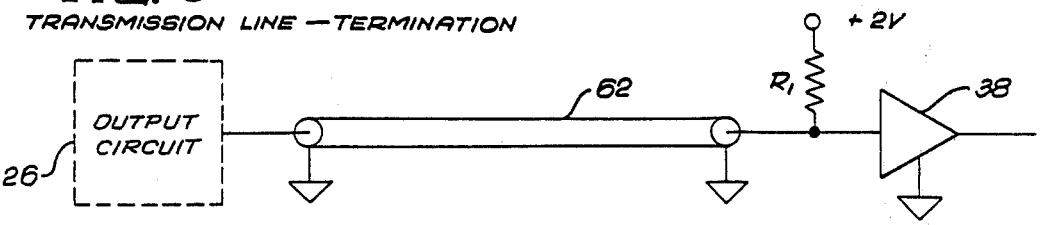
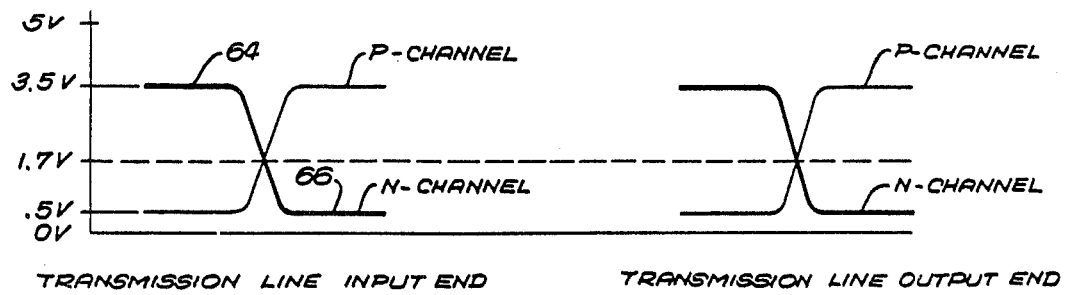

CMOS CIRCUIT USING TRANSMISSION LINE INTERCONNECTIONS

BACKGROUND OF THE INVENTION

1. Field of the Invention

This invention relates to interconnections between digital integrated circuits, and more particularly to interconnections between integrated circuits in high speed computers. Specifically, this invention relates to high speed computers utilizing complementary metal oxide semiconductor (CMOS) circuitry and the use of transmission lines for interconnections between CMOS circuits.

2. Description of the Prior Art

In high speed computers which incorporate a large number of integrated circuit chips, logic decisions within a chip are accomplished at an extremely high speed. In a typical integrated circuit chip, logic decisions may be made in a nanosecond or less. In addition to the speed of operations performed within the integrated circuit, however, the ultimate speed of the computer is a function of the speed at which signals can be transmitted from an output of one integrated circuit to the input of another integrated circuit. If the transmission time between chips is slow, the computer will be slow despite the high speed operation of the integrated circuit chips themselves.

One method of interconnecting chips is simply by using a plain wire. Because of the random capacitance and inductance associated with such a connection, however, the transmission time of a useful signal can be quite high. In order to eliminate signal degradation caused by random capacitance and inductance, it is desirable to use transmission lines as connectors. Transmission lines, which have the characteristic of having uniform inductance and capacitance per unit length, provide extremely high speed transmission. The propagation speed through a transmission line is equal to the speed of light, degraded by the dielectric constant of the insulator used in the transmission line. Propagation speed in a typical transmission line is about six inches per nanosecond. Therefore, it is very desireable to utilize transmission lines for interconnections between integrated circuits in a computer, particularly when the integrated circuits are spaced apart by a relatively large distance.

Prior art high speed computers have typically utilized emitter coupled logic (ECL) circuitry. ECL circuitry generally utilizes one volt signal swings, and transmission lines having a 100 ohm characteristic impedance are typically used to provide interconnections between chips. In order to provide the necessary one volt signal swing with these transmission lines, the output circuits of the ECL chips must provide a 10 milliamp drive current. Although this drive current is relatively low, the computer has the disadvantage of having high DC power dissipation ECL circuitry.

CMOS technology has several advantages over ECL which makes it attractive for use in high speed computers. Primary among these is the fact that CMOS circuits consume little or no DC power, i.e., power is required only when the circuit is switching. However, CMOS circuits typically have a five volt signal swing, and would have to provide a 50 milliamp drive current to drive a 100 ohm transmission line on a chip. Such a drive requirement corresponds to 250 milliwatts per output line. Because of this excessive power requirement, transmission lines have not been used for interconnections between CMOS chips. Instead, plain wires having associated random (or lump) capacitance have been employed, with the result being that signal propagation from the output of one chip to the input of another is quite slow. As a consequence of the impracticability of using transmission lines, CMOS circuitry typically has not been used in high speed computers, but instead is used in applications where transmission speed requirements are not critical.

SUMMARY OF THE INVENTION

The present invention is directed to a system which enables transmission lines to be utilized as interconnections between integrated circuits employing CMOS devices. This results in a system which combines the high transmission speed characteristic of ECL and the low DC power consumption characteristic of CMOS circuitry. The invention relates to the design of the output circuits of a chip, the termination of the transmission lines, and the choice of switching threshold for receiving circuits. The design enables interconnections to be made by means of (a) a transmission line between an output circuit and a single input circuit, (b) a transmission line from an output circuit to several distributed input circuits, and (c) plain plain wire connections between output circuits and input circuits.

The most typical interconnection is one in which a transmission line is connected between a single output circuit and a single input circuit. A CMOS receiving circuit has the characteristic that it appears to present an open circuit to the transmission line, i.e., the line is not terminated. This results in complete reflection of the signal provided by the output circuit. This reflection causes a doubling of the amplitude of the signal at the end of the transmission line (i.e., at the receiving circuit). Because of this doubling of the signal, the output circuit can be designed to provide only one-half of the drive current which would normally be necessary to obtain the desired voltage swing at the receiving circuit. This greatly reduces the power consumed by the output circuits during switching. In addition, the output driver is configured so that its output impedance is substantially equal to the characteristic impedance of the transmission line. This serves to provide a series termination for the transmission line at the output driver end, resulting in absorption of the reflected waveform.

With respect to the situation where a single output circuit is connected to a number of distributed receiving circuits via a transmission line, the transmission line is terminated in a parallel fashion. This termination reduces the signal swing at the receiving circuit; however, the switching threshold of the receiving circuit is chosen such that the reduced signal swing is still sufficient to cause switching to occur. The termination requires connection to a supply voltage and therefore dissipates some DC power. However, this interconnection is used for a small percentage of the total connections, and overall power consumption of the chip thus remains quite low.

When the distance between the output circuit and input circuit is relatively short, plain wire interconnections can be utilized while maintaining adequate propagation time. The characteristics of the output driver which are chosen to enable it to drive a transmission line do not effect its ability to drive plain wires.

BRIEF DESCRIPTION OF THE DRAWINGS

The invention will be described with reference to the appended drawings, wherein:

FIG. 1 is a block diagram showing several integrated circuit chips and interconnections therebetween.

FIG. 2 is a schematic diagram of an output circuit of an integrated circuit chip.

FIG. 3 is a block diagram showing a random wire connection between an output circuit and an input circuit.

FIG. 4 is a diagram showing switching waveforms associated with the interconnection scheme of FIG. 3 is utilized.

FIG. 5 shows a transmission line interconnection between an output circuit and a single input circuit.

FIG. 6 shows switching waveforms associated with the circuit of FIG. 5.

FIG. 7 is a diagram showing the characteristics of transistors used in the circuit of FIG. 2.

FIG. 8 is a block diagram showing the interconnection used between an output circuit and a number of input circuits. This interconnection system employs transmission lines and termination circuitry.

FIG. 9 shows waveforms associated with the interconnection scheme of FIG. 8.

DESCRIPTION OF THE PREFERRED EMBODIMENT

The following description is of the best presently contemplated mode of carrying out the invention. This description is made for the purpose of illustrating the general principles of the invention and is not to be taken in a limiting sense. The scope of the invention is best defined by the appended claims.

Referring to FIG. 1, a portion of a high speed computer may contain a number of integrated circuit chips 10, 12, 14 and 16. Each chip includes an internal circuit 18 and a number of input and output pads. The output pads are connected to output driver circuits (not shown) which receive signals from the internal circuit 18, and the input pads are connected to input or receiver circuitry (not shown) which provides signals to the internal circuit 18. In FIG. 1, output pads are represented by squares and input pads are represented by circles. In operation, each output pad would be connected to one or more input pads. This connection is made in one of three fashions. The most used interconnection (approximately 80% of all interconnections) is a transmission line 20 which is connected between a single output pad 10A of the chip 10 and a single input pad 12A of the chip 12. A second interconnection which is employed utilizes a transmission line 22 to connect an output pad 10B of the chip 10 to a number of input pads 12B, 12C and 14A. This connection includes a termination resistor 23 at the end of transmission line 22. A third interconnection scheme, utilized when the distance between the pads to be connected is relatively short (approximately 6 inches or less) employs plain wire 24 to connect an output pad 16A to input pads 12D and 12E.

FIG. 2 is a schematic diagram of a CMOS chip output circuit 26. The output circuit includes complementary P-channel and N-channel MOS transistors 28 and 30, respectively. The output circuit also includes a second pair of complementary transistors 32 and 34 which receive an input signal $V_{in}$ and provide a signal on line 36 to drive the transistors 28 and 30. The transistors 28, 30, 32 and 34 are all powered by supply voltage $V_{DD}$. The transistor pair 28 and 30 provides an output signal $V_{ot}$ which is delivered to an output pad. The purpose of the dual CMOS drivers 32, 34 and 28, 30 is to decrease the load on the internal circuit 18. Transistors 32, 34 form an inverter that is approximately three times the size of an internal circuit element. This inverter drives transistors 28, 30 that are approximately ten times the size of an internal inverter. Sufficient output is thus provided by the output circuit without requiring a large drive from the internal circuit. A single CMOS pair of transistors could also be used.

Referring to FIG. 3, the output circuit 26 is shown connected to a receiving circuit 38 by means of a plain wire connection 40. As stated above, such a connection is utilized when the distance between the output circuit and receiving circuit is relatively small. When such is the case, the delay in obtaining a useful signal resulting from random capacitance is not so great as to significantly slow the operation of the system.

The switching characteristics of the plain wire connection of FIG. 3, (i.e., the signals at the input to the receiving circuit) are shown in FIG. 4. When the output circuit is switching from "1" to a "0", the N-channel transistor 30 is utilized to pull the output $V_{ot}$ from 5 volts down to 0 volts, as shown by line 42. This transition occurs in a relatively short time period T1, due to the relatively large current carrying capabilities of the N-channel transistor 30. When the output circuit 26 is switching from a "0" to a "1", the P-channel transistor 28 is utilized to pull the voltage from 0 volts up to 5 volts. This action is indicated at line 44. Because the P-channel transistor provides significantly lower drive currents than the N-channel transistor, the time T2 that it takes to go from 0 to 5 volts is significantly greater than T1. Typically, the threshold voltage of the device to be switched (i.e., the receiving circuit 38 in this instance) would be set midway between the voltage extremes, i.e., at 2.5 volts. As can be seen in FIG. 4, this would result in a relatively fast transition from the high state to low state, but a slow transition from the low state to the high state. Since the system timing must allow for the slowest transition in order to insure that every transition will be made, the time it takes for the signal of line 44 to rise from zero to 2.5 volts would be the limiting factor with respect to the switching speed of the system. The transition from 5 volts to 2.5 volts will occur much more rapidly. However, this will not increase the overall system speed. In order to minimize the transition time which must be allowed, the receiving circuit 38 is designed to have a reduced switching threshold. In the present embodiment of the invention, the threshold is about 1.7 volts. By reducing the threshold, the time for detection of a rising transition becomes approximately the same as that for a falling transition. Additional capacitance will cause the switching times to be increased, as indicated by lines 42A and 44A, but the positive and negative transition times will remain approximately equal to each other.

Thus, when the output circuit 26 is connected to a plain wire, random capacitances will cause transition delays. In order to minimize the effect of these delays, the threshold of the receiving circuit 38 is shifted downward so as to take into account the different current capabilities of the P-channel and N-channel transistors of the output circuit. For short interconnections, the delays due to the random capacitance are not large enough to appreciably hamper system speed.

FIG. 5 illustrates an interconnection in which the output circuit 26 is connected to a receiving circuit 38 by means of a transmission line 46. The CMOS receiving circuit 38 appears substantially as an open circuit to the transmission line 46. The output circuit 26 can be modeled as a voltage source 48 and an output impedance 50. The transmission line 46 may be coaxial cable, PC board transmission line or some other type of transmission line. The receiving circuit is identical to that shown in FIG. 3.

FIG. 6 shows the signals associated with the interconnection arrangement of FIG. 5. Since the receiving circuit 38 appears as an open circuit to the transmission line 46, a signal from the output circuit 26 will be completely reflected when it reaches the output end of the transmission line. The output circuit 26 is designed to take advantage of this characteristic of complete reflection for a nonterminated line. Since the signal is completely reflected, the amplitude of the signal at the receiving circuit 38 will be double that of the initial signal provided by the output circuit 26. This is due to the fact that the reflected signal will combine with the incident signal. Because of this, the output circuit 26 need only provide an output swing which is one-half of that required by the receiving circuit 38. Thus, if a 5 volt signal swing is desired for the receiving circuit 38, the output circuit 26 need only provide a 2.5 volt swing. This cuts the drive current requirements of the output circuit 26 in half. Assuming that the transmission line 46 has a characteristic impedance of 100 ohms, a 5 volt signal swing from the output circuit would require that the output circuit be capable of delivering 50 milliamps. However, a 2.5 volt signal swing requirement means that the output circuit need only deliver 25 milliamps. The open circuit characteristic of the CMOS receiving circuit 38 thus cuts the current requirements of the output driver 26 by one-half.

Because of the different current carrying capabilities of P-channel and N-channel transistors of a given size, the P-channel transistor in a CMOS pair is usually has lower current carrying capability than the N-channel transistor. If the two transistors were designed to have approximately equal current capability, the P-channel transistor would require an inordinate amount of chip space. In the output circuit of FIG. 2, the N-channel transistor 30 is designed to have a drive current capability of approximately 25 milliamps, while the P-channel transistor 28 is designed to have a drive current capability of approximately 15 milliamps. Twenty-five milliamps into the 100 ohms impedance of the transmission line 46 will provide a 2.5 volt signal swing. This is indicated at 52 in FIG. 6. This 2.5 volt swing will result in a 5 volt signal at the receiving circuit 38, due to the reflection caused by the open circuit. This is indicated at 54 in FIG. 6. Thus, although the output circuit 26 will only provide a 2.5 volt signal, the receiving circuit 38 will be positively switched by a 5 volt signal.

The signal which is reflected from the output end of the transmission line 46 will combine with the signal from the output circuit 26 at the input of the transmission line to form a composite signal 56 as shown in FIG. 6. If reflected by the output circuit, this signal could interfere with the detection of switching transitions. In order to avoid such an occurrence, the output circuit 26 is designed so that its output impedance 50 is approximately equal to the characteristic impedance of the transmission line 46. As a result, the output circuit 26 provides a series termination for the input end of the transmission line 46 and will completely absorb the reflected signal.

Since the P-channel transistor 28 has a drive capability of only 15 milliamps, it will provide a voltage swing of 1.5 volts into the transmission line 46. This is indicated at 58 in FIG. 6. This will result in a 3 volt signal swing 60 at the receiving circuit 38. This 3 volt swing is more than sufficient to cause a transition in the circuit 38, however, since the switching threshold is at 1.7 volts. Thus, the lower switching threshold which is advantageous with respect to the use of a plain wire interconnection is also beneficial when a non-terminated transmission line is utilized, in that it insures that switching will occur upon the first reflection even though the P-channel transistor provides relatively low current.

The characteristics of the P-channel transistor 28 and the N-channel transistor 30 are shown in FIG. 7. The N-channel transistor is shown as having a saturation current of 25 milliamps and the P-channel transistor is shown as having a saturation current of 15 milliamps. The transistors are also designed so that they have a 100 ohm slope, so as to provide the proper termination impedance for the transmission line 46. Methods for designing transistors to have these characteristics are well-known in the art and need not be described here. In general, saturation currents of approximately 20-30 milliamps for the N-channel transistors and 10-15 milliamps for the P-channel transistors are preferred.

Thus, by providing a receiver circuit which appears as an open circuit connection to a transmission line, a CMOS output circuit can be designed which need only provide one-half the signal swing which is required by the receiving circuit. This significantly reduces the drive current requirements of the output circuit. In addition, the drive current supplied by the N-channel and P-channel transistors of the output circuit need not be equal. The reduced switching threshold insures that transistions will be detected on the first pass from the output circuit to the receiving circuit, despite the fact that the signal at the receiving circuit will not necessarily have a full 5 volt swing.

The final interconnection scheme which is utilized in the high speed computer circuitry of the present invention is shown in FIG. 8. This situation is one in which one output circuit is connected to a number of receiving circuits by means of a transmission line. In this instance, a transmission line 62 is connected between a CMOS output circuit 26 and CMOS receiving circuit 38, with a partial termination being provided at the end of the transmission line by means of resistor R1. The resistor R1 is connected a 2 volt supply.

The operational characteristics of the interconnection scheme of FIG. 8 are shown in FIG. 9. In both the positive and negative transitions, the signal swing will vary between about 3.5 volts and 0.5 volts. Due to the termination provided by the resistor R1, the output signals from the circuit 26 will be the same as the input signals at the receiver circuit 38 (i.e., no reflection will occur). In the negative transition, this interconnection provides a signal that goes from approximately 3.5 volts down to approximately 0.5 volts, as shown by waveform 64. In the positive transition, the signal changes level from 0.5 volts to 3.5 volts. When the output circuit is changing from a low state to a high state, the P-channel transistor 28 will provide approximately 15 milliamps into the 100 ohms of the transmission line 62. This gives an output of 1.5 volts above the 2 volt supply voltage, i.e., 3.5 volts. In the negative transition, the N-channel transistor 30 can only provide about 15 milliamps because it moves out of the saturated region into the linear region (FIG. 7). This corresponds to 1.5 volts below the 2 volt supply, i.e., 0.5 volts. The 1.7 volt threshold of the receiving circuit 38 thus also functions advantageously when this interconnection scheme is utilized, i.e., it is approximately midway between the voltage levels of the high and low states.

Thus, when the terminated transmission line of FIG. 8 is employed, the signal swing of the output circuit will be reduced and DC power will be dissipated (due to the connection of the 2 volt supply voltage). This interconnection is therefore less desireable than the nonterminated transmission line of FIG. 5. However, the scheme of FIG. 5 can only be used when there is a single load at the end of the line. When a number of receiver circuits are connected to a single output (i.e., 22 in FIG. 1), the connection scheme of FIG. 5 would not work at high speeds since the switching signal is only at half amplitude when it first passes a receiving circuit and switching would not occur until a reflection combined with the original signal. Relatively few interconnections in a computer system employ such a multiple load transmission line, and the overall power dissipation of the system is thus maintained very low.

It should be noted that the CMOS output circuit of the present invention can also be employed to drive transistor-transistor logic (TTL) circuitry, since the voltage swings used for both technologies are generally the same. Generally, TTL circuits would be driven with plain wire interconnections.

In summary, the present invention provides a CMOS output circuit which can drive a nonterminated transmission line (with the output circuit providing termination for the input end of the line), a terminated transmission line (at the expense of reduced signal swing and increased power dissipation), and random wires. The switching threshold of the CMOS receiving circuits is set lower than normal and enables increased switching speeds to be achieved. The use of transmission lines significantly increases the propagation speed between chips, thus allowing the computer cycle time to be decreased. The nonterminated interconnection is utilized for the majority of connections, with the result being that the power dissipation of the computer system is significantly lower than ECL systems.

I claim:

1. A high speed circuit for use in digital computers or the like, comprising:
   a first integrated circuit chip including a plurality of CMOS output circuits;
   a second integrated circuit chip including a plurality of CMOS receiver circuits; and
   a first transmission line connected between an output circuit and a receiver circuit, wherein the transmission line is not terminated at the receiver circuit end to thereby result in a reflection of a signal from the output circuit, said reflected signal combining with the signal from the output circuit to increase the amplitude of the signal at the receiving circuit and thereby reduce the current requirements of the output circuit, wherein the output impedance of the output circuit is approximately equal to the characteristic impedance of the transmission line so as to provide termination for the end of the transmission line connected to the output circuit to thereby absorb reflected signals.

2. The circuit of claim 1 wherein each output circuit comprises a complementary pair of MOS transistors having differing situation currents, and wherein each receiving circuit has a switching threshold which will insure a single reflection will be sufficient to cause switching of the receiver circuit.

3. The circuit of claim 2 wherein each output circuit comprises a P-channel transistor having a saturation current of approximately 10 to 15 milliamperes and an N-channel transistor having a saturation current of approximately 20 to 30 milliamperes.

4. The circuit of claim 3 wherein the transmission line has a characteristic impedance of approximately 100 ohms and the switching threshold of the receiving circuit is approximately 1.5 to 2.0 volts.

5. The circuit of claim 1 including:
   a second transmission line connected between an output circuit and two receiver circuits; and
   termination means for terminating the second transmission line to prevent reflections from occurring.

6. The circuit of claim 5 wherein the termination means includes a supply voltage which results in a voltage swing being developed at the receiver circuit which is sufficient to cause switching of the receiver circuit.

7. The circuit of claims 1 or 5 including a connector, which does not function as a transmission line, connected between an output circuit and a receiver circuit, wherein the switching threshold of the receiver circuit is at a level which results in detection of a transition in the output of the output circuit in approximately the same time for a transition from a low state to a high state as for a transition from a high state to a low state.

8. A circuit for use in a high speed digital computer or the like, comprising:
   a plurality of integrated circuit chips, each chip having a plurality of CMOS output circuits and a plurality of CMOS receiver circuits;
   a plurality of first transmission lines having a predetermined characteristic impedance, one each connecting an output circuit to a receiver circuit, wherein said first transmission lines are not terminated;
   wherein each output circuit includes a complementary pair of MOS transistors providing saturation currents which produce a voltage swing on the first transmission line that is substantially less than the voltage swing necessary for operation of the receiver circuit, wherein signals from the output circuit will be reflected at the receiver end of the transmission line, said reflected signal combining with the original signal to provide a signal to the receiver whose voltage swing is approximately double that of the original signal to thereby properly operate the receiver circuit, and wherein each output circuit has an output impedance which is substantially equal to the characteristic impedance of the transmission line to thereby provide termination for the end of the transmission line connected to the output circuit so as to absorb reflected signals.

9. The circuit of claim 8 wherein each output circuit includes an N-channel transistor and a P-channel transistor having a substantially lower saturation current than the N-channel transistor, wherein the receiver circuits have a switching threshold which insures that switching will occur upon an initial reflection irrespective of whether the N-channel or P-channel transistor is driving the transmission line.

10. The circuit of claim 9 including a second transmission line connected between an output circuit and one or more receiver circuits and termination means for terminating the end of the second transmission line connected to a receiver circuit, said termination means including a supply voltage which results in a voltage swing at the receiver circuit sufficient to insure that transitions in the output circuit will be detected by the receiver circuits.

11. A circuit for use in high speed computers or the like, comprising:
- a plurality of integrated circuits having CMOS output circuits and CMOS receiver circuits; and
- a plurality of transmission lines, one each connected between an output circuit and a receiver circuit, wherein the transmission lines are not terminated at the end connected to the receiver circuit so that a reflection signal aids in the switching of the receiver circuit and wherein the output impedance of the output circuit is approximately equal to the characteristic impedance of the transmission lines, said interconnection reducing the current requirements of the output circuits.

12. An integrated circuit which includes a plurality of CMOS output circuits which are capable of being interconnected to receiver circuits of other integrated circuits by means of (a) transmission lines which are terminated at their output ends, (b) transmission lines which are not terminated at their output ends, or (c) non-transmission line random capacitance connectors, each of said output circuits comprising:
- a pair of complementary MOS transistors which provide saturation currents that produce a voltage on a non-terminated transmission line which is substantially less than that necessary to develop the desired voltage level at the receiver circuit, wherein a signal from the output circuit will be reflected at the receiver end of the transmission line and combine with the incident signal to provide a signal to the receiver circuit of approximately twice the amplitude of the output signal, wherein the transistors have an output impedance which is substantially equal to the characteristic impedance of the transmission lines to thereby provide a termination for the input end of the transmission line.

* * * * *